(12) United States Patent
Interrante et al.

(10) Patent No.: US 6,259,155 B1
(45) Date of Patent: Jul. 10, 2001

(54) POLYMER ENHANCED COLUMN GRID ARRAY

(75) Inventors: Mario John Interrante, New Paltz; Raymond Alan Jackson, Fishkill; Sudipta Kumar Ray, Wappingers Falls; Paul A. Zucco, Elizaville; Scott R. Dwyer, Troy, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/290,311

(22) Filed: Apr. 12, 1999

(51) Int. Cl.⁷ .......................... H01L 23/48; H01L 23/52; H01L 29/40
(52) U.S. Cl. .......................... 257/690; 257/693; 257/778; 257/783; 257/792
(58) Field of Search .................... 257/690, 693, 257/699, 697, 779, 792, 678, 783, 704, 778

(56) References Cited

U.S. PATENT DOCUMENTS

| | | | |
|---|---|---|---|
| 5,324,892 | * 6/1994 | Granier et al. | 174/250 |
| 5,355,580 | 10/1994 | Tsukada | 29/840 |
| 5,471,027 | 11/1995 | Call et al. | 257/706 |
| 5,476,211 | * 12/1995 | Khandros et al. | 228/180.5 |
| 5,483,421 | 1/1996 | Gedney et al. | 361/771 |
| 5,659,203 | 8/1997 | Call et al. | 257/778 |
| 5,697,148 | 12/1997 | Lance, Jr. et al. | 29/842 |
| 5,766,982 | 6/1998 | Akram et al. | 438/51 |
| 5,869,904 | * 2/1999 | Shoji | 257/779 |
| 5,930,597 | 7/1999 | Call et al. | 438/106 |

FOREIGN PATENT DOCUMENTS 2-35764 * 2/1990 (JP).
4-142765 * 5/1992 (JP).

* cited by examiner

Primary Examiner—Jhihan B Clark
(74) Attorney, Agent, or Firm—Margaret A. Pepper

(57) ABSTRACT

A ceramic column grid array package suitable for mounting application specific integrated circuits or microprocessor chips onto a printed circuit board employing polymer reinforced columns on the substrate module is described. The polymer enhancement is formed by coating a thin conformal film of a polymer, such as, a polyimide onto the substrate module after the formation of the ceramic column grids to mechanically enhance the column to substrate attachment of the column to the substrate prior to mounting on a printed circuit card. Upon curing of the polymer film at a temperature below the melting point of the solder bond attaching the column grid to the substrate, the columns will be mechanically reinforced in their attachment to the substrate. Upon removal of the substrate module from a printed circuit card during rework, the columns of the grid array will remain with the substrate module, leaving no columns on the printed circuit card.

22 Claims, 2 Drawing Sheets

POLYMER ENHANCED COLUMN GRID ARRAY

BACKGROUND OF THE INVENTION

1. Field of the Invention

The present invention relates generally to semiconductor packaging and more particularly to a ceramic column grid array package formed with polymer reinforcement of the columns on a chip carrier substrate.

2. Description of Related Art

Ceramic column grid array packages are used in many high performance application specific integrated circuits and microprocessor chips. In a typical manufacturing process of bonding, assembly and test, the wire connections for a ceramic column grid array are attached near the end of the manufacturing cycle, thus minimizing handling damage. A problem with wire column grid array processing is that during printed circuit card rework, the columns on the grid array packages may come off from the package substrate side and stay behind on the printed circuit card. Multiple localized heating on the printed circuit card side to remove these columns is time and labor intensive and may damage the printed circuit card by causing land delaminations.

A purpose of the present invention is to provide an enhanced ceramic column grid array and method for mechanically stabilizing the wires of the column grid on its substrate.

Another purpose of the present invention is to provide an enhanced column grid array which may be reworked wherein the column grids stay with their substrate and do not remain with the printed circuit card.

SUMMARY OF THE INVENTION

The above and other purposes which will be apparent to one skilled in the art are achieved by the present invention which in one aspect a polymer having a low glass transition temperature is coated on the substrate after attachment of the column grid array wires. Upon curing of the polymer, the polymer mechanically reinforces the base or fillet of the column grid array wires to enhance the attachment of the wires to the ceramic column grid substrate. The polymer may be injected or spin coated onto the substrate, then cured at a temperature below the melting point of the wire column solder material. Upon removal of the ceramic column grid array mounted on a printed circuit card, all of the wire grids will remain with the array package and none of the columns will remain with the card itself.

BRIEF DESCRIPTION OF THE DRAWINGS

The foregoing and other purposes, aspects and advantages will be better understood from the following detailed description of a preferred embodiment of the invention with reference to the drawings, wherein.

DESCRIPTION OF THE PREFERRED EMBODIMENT

The present invention is useful for semiconductor packages such as application specific integrated circuits and microprocessors employing ceramic column grid array packaging techniques. The invention is particularly suited to wire column grid arrays. A wire ceramic column grid array is an often used package structure and the method for forming its structure is known to those skilled in the art. The wire ceramic column grid array is attached at the very end of the bonding, assembly and test manufacturing cycle of semiconductor integrated circuits and, thus, minimizes handling damage.

Figure 1:
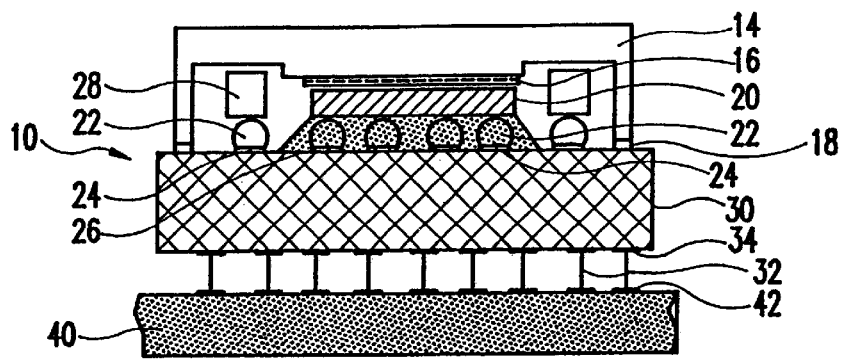
FIG. 1 illustrates a typical column grid array package module after assembly to a card.

A ceramic column grid array module 10 as shown in FIG. 1 is typically mounted onto a printed circuit card or board 40. The ceramic column grid array module 10 is formed by securing a chip 20 to a substrate or module 30 via a plurality of solder balls 22 on pads 24, that are on the substrate or module 30. The substrate 30 could also have one or more electronic devices 28 such as for example, a decoupling capacitors 28, that are also electrically connected to substrate 30 vias the pads 24 and solder balls 22. For some applications the solder balls 22 and pads 24 could be encapsulated with an encapsulate 26, such as, an epoxy. A thermally conductive material 16 is usually applied over the exposed surface of the chip 20 such that a direct thermal contact is made between the chip 20 and the cap or cover 14 when the cover 14 is placed over to protect the chip 20. A cover sealant 18 is typically provided in order to secure the cap or cover 14 to the substrate or module 30. The substrate 30 is typically attached to a printed circuit card via input/output means 32, such as wire columns 32 which are bonded using eutectic solder 36 to pads 34 on the substrate, as more clearly shown in FIG. 3A. The wire columns of the grid array are typically bonded to a printed circuit card 40 by use of eutectic solder 38 to card lands 42, as more clearly shown in FIG. 3A.

Figure 2:
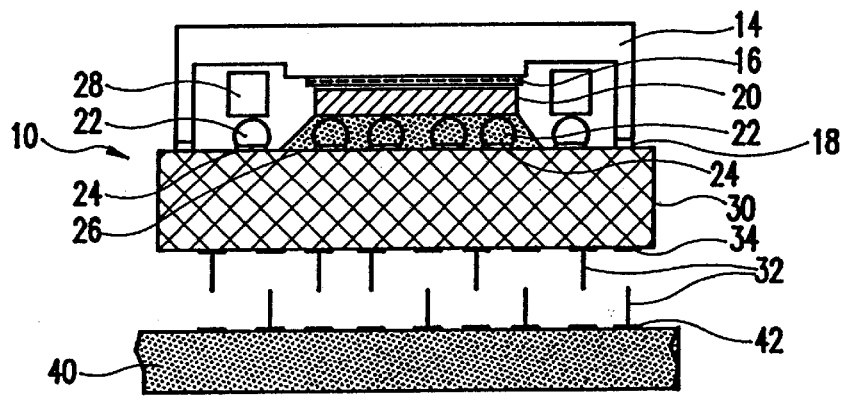
FIG. 2 illustrates a typical column grid array package module after removal from a printed circuit card.

The printed circuit card is usually made up of one or more layers of conducting films comprising an organic laminate composite. Sometimes during testing of printed circuit cards a failure occurs and a ceramic column grid array package module must be removed from the printed circuit card. When doing this the ceramic column grid array often leaves wire interconnections on both the chip carrier or module substrate as well as on the organic printed circuit card. The result after removal of the column grid array module 10 from the card 40 is shown in FIG. 2 where some of the wire columns are attached to the substrate 30 and some remain attached to the printed circuit card 40. Multiple localized heating on the card side is needed to remove these columns that remain on the card. The columns are removed by a time and labor intensive process in which a hand held hot gas tool is used to heat up the removal site and when the eutectic solder interface melts, the columns are picked up by a vacuum nozzle. Care must be exercised to prevent damage of the card due to conductor wiring delaminations on the card.

Figure 3:
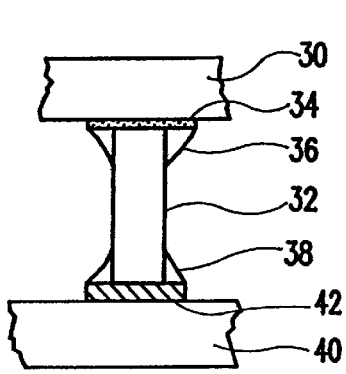
FIG. 3A illustrates a detailed view of the eutectic solder bonding a solder column to a card and a substrate.
FIG. 3B illustrates a detailed view of a wire column structural failure during printed circuit card rework.

A detailed view of the wire column 32 is shown in FIG. 3A. The wire column 32 is typically formed of a solder alloy having a high melting point in the range of 270–300 C. The wire column material is wettable with low melting point solder. The high melting material forming the wire columns is made of lead/tin where the tin ranges from about 5% to about 30%. Small amounts of additional material such as silver at about 3% may be used to form the wire columns. Alternatively, the wire columns 32, may be formed of near solid tin, such as about 99% tin/1% germanium or about 97% tin/3% copper. The diameter of the wire column 32 is in the range of about 0.3–0.5 mm, which is sufficient to provide good electrical interconnections for the microelectronic devices. The height of the wire columns 32, is in the range of about 1.0 mm to about 2.5 mm.

As shown in FIG. 3A the wire column 32, is attached to the substrate bottom surface metallurgy on a pad 34 with eutectic solder 36. Similarly, the other end of the wire column 32, is attached to the printed circuit card land 42 using an eutectic solder 38. The eutectic solder forms a fillet, that is a concave junction where the wire column meets the pad 34 or land 42. The eutectic solder may be 63/37 tin/lead for both item 36 and/or 38 or one could use other ratios of lead to tin which give different melting points. The same solder may be used for both the bonds 36 and/or 38, however, a different solder material could also be used for each.

A common failure mechanism as shown in FIG. 3B where upon removal of the module, the eutectic solder 36 breaks near the module pad 34, as shown in the FIG. 3B, or breaks at the eutectic solder bond 38 near the printed circuit card land 42, (not shown).

The present invention utilizes a standard ceramic wire column grid array attached to the substrate in the same manner as previously shown with the addition of a thin polymer coating 50, in such a way as to cover the fillet of the columns 32. The polymer chosen must have appropriate coating and temperature properties. The polymer 50, must be capable of being dispensed or spin coated to provide a thin conformal coating to the fillets of the column. A typical thickness of the cured film is in the range of about 5 to about 50 microns with a preferred thickness being about 5 to about 15 microns. Alternative methods of coating such as injecting small amounts of polymer at one or more corners of a column grid array and allowing surface tension to spread the material may also be used. The substrate 30 is typically made of ceramic, but an organic substrate or silicon substrate may be used provided good adhesion of the polymer to substrate can be obtained.

The polymer used must be cured at a temperature below the melting point of eutectic used in the column grid array connections. Typically, the lead/tin eutectic melting point is around 180° C. The polymer must be, therefore, cured below this temperature. The glass transition temperature of the polymer, that is the temperature that the polymer soften, should be less than the melting point of the lead tin, used to form the wire columns.

The polymer 50, should adhere well to the ceramic substrate 30, and the bottom surface of metal pads 34, and have adequate adhesion to the lead/tin solder 36, surface which bonds the wire columns 32, to the substrate pads 34. The thin polymer coating 50, will prevent the 90/10 solder bonded columns from separating from the molten eutectic during card rework. The polymer 50, will provide a mechanical reinforcement to the ceramic column grid array to ensure that the columns 32, will remain with the semiconductor module and the module can be reused if required.

A preferred polymer material is a siloxane polyimide having a glass transition temperature of about 142° C. An approximate 4–5% percent solution of siloxane polyimide in1-methyl-2-pyrrolidinone (NMP) was found to work well as the polymer coating. Another coating found to work well is the polyimide Ultem 1040 (Tm) from General Electric which has a glass transition temperature of about 180° C. Other low temperature solder interfaces such as tin/antimony have a melting point of about 232° C. or lead/tin solders having a melting point range of between about 190 to about 240° C. or other various ratios can be used instead of the lead/tin eutectic solder. In addition, transient liquid solder interfaces such as Palladium doped eutectic solder can also be used with this invention.

Figure 4:
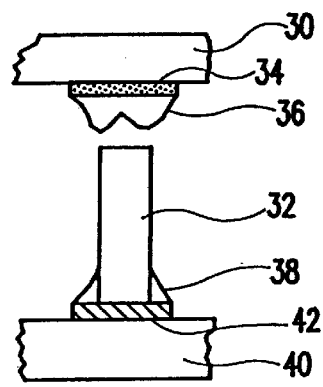
FIG. 4A illustrates a polymer enhanced column grid array coated according to the method of the present invention.
FIG. 4B illustrates a detailed view of a polymer encapsulated wire column.
Figure 4A:
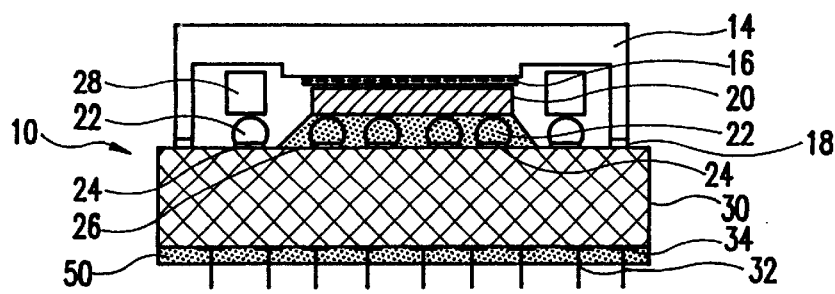

The process for forming the polymer enhanced ceramic column grid array is as follows. The ceramic column grid array module 10, such as the one shown in FIG. 4A, is placed in a plasma asher to clean the surface of the substrate 30. Following the ashing step, a thin layer of adhesion promoter such as A1100, gamma-aminopropyltriethoxysilane, a silane based coupling agent from Union Carbide is coated as a thin layer on the substrate. Then the substrate is heated to between 105 and about 110° C. and an appropriate siloxane polyimide solution is dispensed on the ceramic substrate. The dispensing can be done either along the edges of the column on each side or on the four corners. The siloxane polyimide, at a substrate temperature of between about 100 and about 120° C. will wick along the columns to form a thin coating on the fillets of the wire column to about 20 to 40 mils up the column shanks from the input-output pads. The polyimide coated substrate is cured in a nitrogen ambient furnace at between about 150 and about 160° C. for one to two hours to cure the polyimide.

Figure 4B:
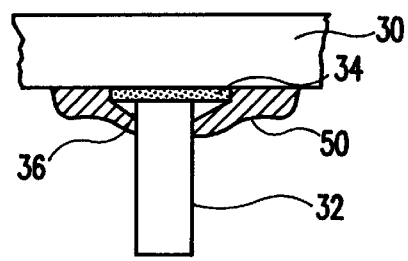

FIG. 4B is a closeup view of a polymer encapsulated column fillet which shows the fillet area of the wire columns 32 at the solder bond 36 have been coated with the polyimide film. The coating on the shank of the wire columns tapers off to a few microns 30 to 40 mils away from the base of the fillets where the column joins to the substrate input-output pads.

Figure 5A:
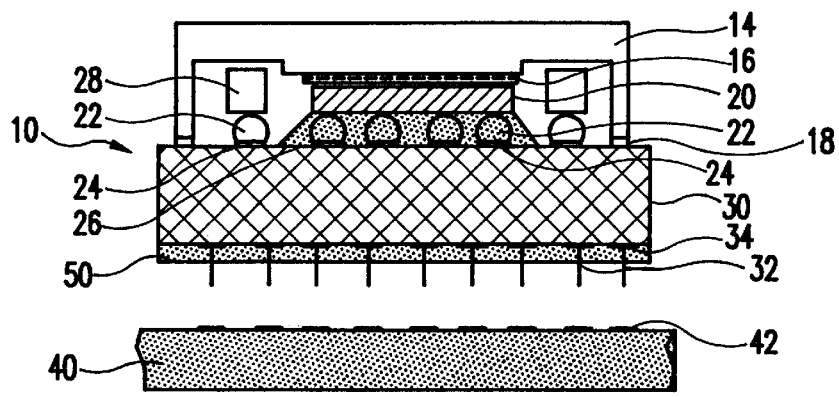
FIG. 5A illustrates a polymer enhanced module after printed circuit card rework.
Figure 5B:
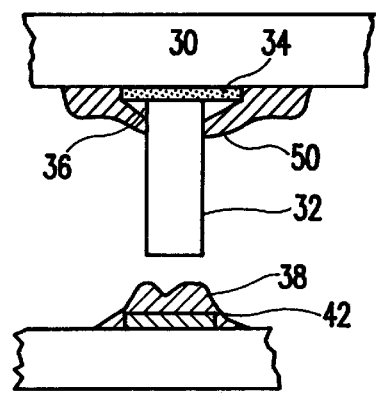
FIG. 5B illustrates a detail view a wire column having polyimide reinforcement according to the present invention after printed circuit card rework.

Upon removal of the module shown in FIG. 5A from an organic printed circuit card, The polyimide mechanically strengthens the column grid array so that the columns stay with the substrate upon removal of the module shown in FIG. 5A from a printed circuit card. As shown in FIG. 5B, the wire column will detach from the card leaving at most a small amount of eutectic lead tin solder on the card land 42, with the wire column 32, remaining with the substrate. Since the polyimide has a glass transition temperature less than 180° C., during removal of the module from the circuit card during rework, the polyimide becomes compliant and prevents the eutectic solder from moving when the solder is molten. As a result the lead/tin columns remain joined to the eutectic solder interface at the module wire column joint and the module is available for reuse.

Having thus described the present invention and its preferred embodiments in detail, it will be readily apparent to those skilled in the art that further modifications to the invention may be made without departing from the spirit and scope of the invention as presently claimed.

What is claimed is:

1. A package for mounting integrated circuit chips onto circuit boards comprising:

a substrate having an integrated circuit chip mounted on a first side and a plurality of input/output pads on a second side;

at least one wire column attached to at least one of the plurality of input/output pads, wherein the at least one wire column is formed of a solder alloy and is attached by a solder bond to the input/output pad;

a polymer coating on the second side of the substrate providing a conformal coating on the solder bond; and an adhesion promoter interposed between the polymer coating and the substrate.

2. The package of claim 1, wherein the at least one wire column is secured to the input/output pad using a low melting point solder.

3. The package of claim 1, wherein the at least one wire column is formed of a high melting point solder alloy.

4. The package of claim 1, wherein the at least one wire column is formed of a solder alloy with a melting point higher than about 270° C. and which is wettable by a solder having a melting point less than about 240° C.

5. The package of claim 1, wherein the at least one wire column has a diameter of about 0.3 to about 0.5 mm and a height of about 1.0 mm to about 2.5 mm.

6. The package of claim 2 wherein the low melting point solder has a melting point in the range of about 180 to about 240° C.

7. The package of claim 1, wherein the polymer coating has a thickness of about 5 to about 40 microns on the substrate and extends onto the at least one wire column to a height of between about 0.3 mm to about 1 mm.

8. The package of claim 1 wherein the polymer is a siloxane polyimide having a glass transition temperature of about 142° C.

9. The package of claim 1 wherein the polymer is Ultem 1040 (Tm) having a glass transition temperature of about 180° C.

10. The package of claim 1 wherein the adhesion promoter has a thickness of about 1 to about 2 microns.

11. The package of claim 1 wherein the adhesion promoter is a silane based coupling agent.

12. The package of claim 1 wherein the adhesion promoter is gamma aminopropyltriethoxysilane.

13. The package of claim 1, wherein the substrate is made of ceramic material, organic material or silicon.

14. The package of claim 1, wherein the polymer has a glass transition temperature which is less than the melting point of the solder alloy of the wire columns.

15. The package of claim 1, wherein the polymer is a siloxane polyimide.

16. The package of claim 1, wherein the polymer is a polyetherimide.

17. The package of claim 4, wherein the at least one wire column is made of lead/tin solder having about 5% to about 30% tin.

18. The package of claim 4, wherein the at least one wire column is made of lead/tin solder having about 2% to about 3% silver.

19. The package of claim 4, wherein the at least one wire column is made of tin having about 1% germanium.

20. The package of claim 4, wherein the at least one wire column is made of tin having about 3% copper.

21. The package of claim 6 wherein the low melting point solder is a tin/lead eutectic.

22. The package of claim 6, wherein the low melting point solder is a tin solder having about 3% to about 5% antimony.

* * * * *